United States Patent
Rusli et al.

(10) Patent No.: US 7,752,752 B1
(45) Date of Patent: Jul. 13, 2010

(54) METHOD OF FABRICATING AN EMBEDDED CIRCUIT PATTERN

(75) Inventors: Sukianto Rusli, Phoenix, AZ (US); Ronald Patrick Huemoeller, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 571 days.

(21) Appl. No.: 11/621,402

(22) Filed: Jan. 9, 2007

(51) Int. Cl.
  *H01K 3/10* (2006.01)
(52) U.S. Cl. .............................. 29/853; 29/852; 174/262
(58) Field of Classification Search .................. 29/830, 29/831, 846, 852, 853; 174/262; 216/17, 216/18, 39; 257/692, 773; 438/680, 700; 324/754
See application file for complete search history.

(56) References Cited

U.S. PATENT DOCUMENTS

| | | | |
|---|---|---|---|
| 3,324,014 A | 6/1967 | Modjeska | 205/122 |
| 3,778,900 A | 12/1973 | Haining et al. | 29/628 |
| 3,868,724 A | 2/1975 | Perrino | 357/65 |
| 3,916,434 A | 10/1975 | Garboushian | 357/74 |
| 4,322,778 A | 3/1982 | Barbour et al. | 361/414 |
| 4,508,754 A | 4/1985 | Stepan | 427/53.1 |
| 4,532,152 A | 7/1985 | Elarde | 427/96 |
| 4,532,419 A | 7/1985 | Takeda | 235/492 |
| 4,604,799 A | 8/1986 | Gurol | 29/847 |
| 4,642,160 A | 2/1987 | Burgess | 156/630 |
| 4,685,033 A | 8/1987 | Inoue | 361/414 |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,806,188 A | 2/1989 | Rellick | 156/89 |
| 4,811,082 A | 3/1989 | Jacobs et al. | 357/80 |
| 4,897,338 A | 1/1990 | Spicciati et al. | 430/314 |
| 4,905,124 A | 2/1990 | Banjo et al. | 361/395 |
| 4,915,983 A | 4/1990 | Lake et al. | 430/314 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |

(Continued)

FOREIGN PATENT DOCUMENTS

JP  05-109975  4/1993

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner*—Donghai D. Nguyen
(74) *Attorney, Agent, or Firm*—Gunnison, McKay & Hodgson, L.L.P.; Serge J. Hodgson (57) ABSTRACT

A method of fabricating a substrate includes forming a first conductive layer on a dielectric layer, forming a resist layer on the first conductive layer, and forming laser-ablated artifacts through the first resist layer, through the first conductive layer, and at least partially into the dielectric layer. A second conductive layer is formed within the laser-ablated artifacts. The laser-ablated artifacts are filled to form an overfilled circuit pattern. The resist layer and the first conductive layer are removed. Further, a portion of the overfilled circuit pattern is removed to form an embedded circuit pattern embedded within the dielectric layer.

13 Claims, 8 Drawing Sheets

U.S. PATENT DOCUMENTS

| | | | |
|---|---|---|---|
| 5,021,047 A | 6/1991 | Movern | 604/110 |
| 5,053,357 A | 10/1991 | Lin et al. | 437/204 |
| 5,072,075 A | 12/1991 | Lee et al. | 174/264 |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | 174/266 |
| 5,229,550 A | 7/1993 | Bindra et al. | 174/262 |
| 5,239,448 A | 8/1993 | Perkins et al. | 361/764 |
| 5,247,429 A | 9/1993 | Iwase et al. | 362/29 |
| 5,263,243 A | 11/1993 | Taneda et al. | 29/830 |
| 5,283,459 A | 2/1994 | Hirano et al. | 257/419 |
| 5,371,654 A | 12/1994 | Beaman et al. | 361/744 |
| 5,379,191 A | 1/1995 | Carey et al. | 361/777 |
| 5,404,044 A | 4/1995 | Booth et al. | 257/698 |
| 5,440,805 A | 8/1995 | Daigle et al. | 29/830 |
| 5,463,253 A | 10/1995 | Waki et al. | 257/724 |
| 5,474,957 A | 12/1995 | Urushima | 437/209 |
| 5,474,958 A | 12/1995 | Djennas et al. | 437/211 |
| 5,508,938 A | 4/1996 | Wheeler | 364/488 |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/769 |
| 5,739,579 A | 4/1998 | Chiang et al. | 257/635 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,774,340 A | 6/1998 | Chang et al. | 361/771 |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | 257/728 |
| 5,894,108 A | 4/1999 | Mostafazadeh et al. | 174/52.4 |
| 5,903,052 A | 5/1999 | Chen et al. | 257/706 |
| 5,936,843 A | 8/1999 | Ohshima et al. | 361/760 |
| 5,952,611 A | 9/1999 | Eng et al. | 174/52.4 |
| 5,990,546 A | 11/1999 | Igarashi et al. | 257/700 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,035,527 A | 3/2000 | Tamm | |
| 6,039,889 A * | 3/2000 | Zhang et al. | 216/17 |
| 6,040,622 A | 3/2000 | Wallace | 257/679 |
| 6,060,778 A | 5/2000 | Jeong et al. | 257/710 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | 257/773 |
| 6,115,910 A | 9/2000 | Ghahghahi | 29/833 |
| 6,119,338 A | 9/2000 | Wang et al. | 29/852 |
| 6,122,171 A | 9/2000 | Akram et al. | 361/762 |
| 6,127,250 A | 10/2000 | Sylvester et al. | 438/584 |
| 6,127,833 A | 10/2000 | Wu et al. | 324/755 |
| 6,160,705 A | 12/2000 | Stearns et al. | 361/704 |
| 6,162,365 A | 12/2000 | Bhatt et al. | 216/13 |
| 6,172,419 B1 | 1/2001 | Kinsman | 257/737 |
| 6,175,087 B1 | 1/2001 | Keesler et al. | 174/261 |
| 6,184,463 B1 | 2/2001 | Panchou et al. | 174/52.4 |
| 6,194,250 B1 | 2/2001 | Melton et al. | |
| 6,204,453 B1 | 3/2001 | Fallon et al. | 174/255 |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | 257/700 |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 | 2/2002 | Iijima et al. | 257/698 |
| 6,352,914 B2 | 3/2002 | Ball et al. | 438/599 |
| 6,353,999 B1 | 3/2002 | Cheng | 29/852 |
| 6,365,975 B1 | 4/2002 | DiStefano et al. | 257/777 |
| 6,368,967 B1 | 4/2002 | Besser | 438/687 |
| 6,376,906 B1 | 4/2002 | Asai et al. | 257/698 |
| 6,378,201 B1 | 4/2002 | Tsukada et al. | 29/852 |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B2 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,418,615 B1 | 7/2002 | Rokugawa et al. | 29/852 |
| 6,426,550 B2 | 7/2002 | Ball et al. | 257/700 |
| 6,451,509 B2 | 9/2002 | Keesler et al. | 430/311 |
| 6,472,306 B1 | 10/2002 | Lee et al. | 438/623 |
| 6,479,762 B2 | 11/2002 | Kusaka | 174/261 |
| 6,497,943 B1 | 12/2002 | Jimarez et al. | 428/209 |
| 6,502,774 B1 | 1/2003 | Johansson et al. | 241/37 |
| 6,517,995 B1 | 2/2003 | Jacobson et al. | 430/320 |
| 6,534,391 B1 | 3/2003 | Huemoeller et al. | 438/612 |
| 6,534,723 B1 | 3/2003 | Asai et al. | 174/255 |
| 6,544,638 B2 | 4/2003 | Fischer et al. | 428/322.7 |
| 6,570,258 B2 | 5/2003 | Ma et al. | 257/774 |
| 6,574,106 B2 | 6/2003 | Mori | 361/705 |
| 6,586,682 B2 | 7/2003 | Strandberg | 174/255 |
| 6,608,757 B1 | 8/2003 | Bhatt et al. | 361/748 |
| 6,637,105 B1 | 10/2003 | Watanabe et al. | 29/852 |
| 6,660,559 B1 | 12/2003 | Huemoeller et al. | 438/106 |
| 6,715,204 B1 | 4/2004 | Tsukada et al. | 29/847 |
| 6,727,645 B2 | 4/2004 | Tsujimura et al. | 313/504 |
| 6,730,857 B2 | 5/2004 | Konrad et al. | 174/257 |
| 6,740,964 B2 | 5/2004 | Sasaki | |
| 6,753,612 B2 | 6/2004 | Adae-Amoakoh et al. | 257/774 |
| 6,787,443 B1 | 9/2004 | Boggs et al. | 438/612 |
| 6,803,528 B1 | 10/2004 | Koyanagi | 174/262 |
| 6,804,881 B1 | 10/2004 | Shipley et al. | 29/830 |
| 6,815,709 B2 | 11/2004 | Clothier et al. | 257/40 |
| 6,815,739 B2 | 11/2004 | Huff et al. | 257/275 |
| 6,822,334 B2 | 11/2004 | Hori et al. | 257/775 |
| 6,891,261 B2 | 5/2005 | Awaya | 257/692 |
| 6,908,863 B2 * | 6/2005 | Barns et al. | 438/700 |
| 6,913,952 B2 | 7/2005 | Moxham et al. | 438/125 |
| 6,919,514 B2 | 7/2005 | Konrad et al. | |
| 6,930,256 B1 | 8/2005 | Huemoeller et al. | 174/260 |
| 6,930,257 B1 | 8/2005 | Hiner et al. | 174/262 |
| 6,940,170 B2 | 9/2005 | Parikh | 257/750 |
| 6,989,593 B2 | 1/2006 | Khan et al. | 257/707 |
| 6,998,335 B2 | 2/2006 | Fan et al. | 438/612 |
| 7,028,400 B1 | 4/2006 | Hiner et al. | 29/852 |
| 7,033,928 B2 | 4/2006 | Kawano | 438/637 |
| 7,061,095 B2 * | 6/2006 | Boggs et al. | 174/262 |
| 7,145,238 B1 | 12/2006 | Huemoeller et al. | 257/750 |
| 7,214,609 B2 | 5/2007 | Jiang et al. | 438/637 |
| 7,242,081 B1 | 7/2007 | Lee | |
| 7,292,056 B2 * | 11/2007 | Matsuda | 324/754 |
| 7,345,361 B2 | 3/2008 | Mallik et al. | |
| 7,372,151 B1 | 5/2008 | Fan et al. | |
| 7,435,352 B2 | 10/2008 | Mok et al. | |
| 2001/0041436 A1 | 11/2001 | Parikh | |
| 2002/0017712 A1 | 2/2002 | Bessho et al. | 257/700 |
| 2003/0000738 A1 | 1/2003 | Rumsey et al. | 174/260 |
| 2003/0128096 A1 | 7/2003 | Mazzochette | 338/22 |
| 2005/0194353 A1 | 9/2005 | Johnson et al. | 216/65 |
| 2005/0205295 A1 | 9/2005 | Tsuk | |

| | | |
|---|---|---|
| 2006/0157854 A1 | 7/2006 | Takewaki et al. |
| 2007/0114203 A1 | 5/2007 | Kang |
| 2007/0273049 A1 | 11/2007 | Khan et al. |
| 2007/0290376 A1 | 12/2007 | Zhao et al. |
| 2008/0230887 A1 | 9/2008 | Sun et al. |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Huemoeller et al., U.S. Appl. No. 10/947,124, filed Sep. 22, 2004, entitled "Method for Making an Integrated Circuit Substrate Having Embedded Back-Side Access Conductors and Vias".

Huemoeller et al., U.S. Appl. No. 11/045,402, filed Jan. 28, 2005, entitled "Method for Making a Semiconductor Package Substrate Having a Printed Circuit Pattern Atop and Within a Dielectric".

Hiner et al., U.S. Appl. No. 11/098,995, filed Apr. 5, 2005, entitled "Method for Making an Integrated Circuit Substrate Having Laminated Laser-Embedded Circuit Layers".

Huemoeller et al., U.S. Appl. No. 11/166,005, filed Jun. 24, 2005, entitled "Circuit-On-Foil Process for Manufacturing a Laminated Semiconductor Package Substrate Having Embedded Conductive Patterns".

Huemoeller et al., U.S. Appl. No. 11/182,985, filed Jul. 14, 2005, entitled "Semiconductor Package Having Laser-Embedded Terminals".

Huemoeller et al., U.S. Appl. No. 11/189,593, filed Jul. 26, 2005, entitled "Integral Plated Semiconductor Package Substrate Stiffener".

Huemoeller et al., U.S. Appl. No. 11/527,827, filed Sep. 26, 2006, entitled "Semiconductor Package and Substrate Having Multi-Level Vias Fabrication Method".

Huemoeller et al., U.S. Appl. No. 11/543,540, filed Oct. 4, 2006, entitled "Method and Structure for Creating Embedded Metal Features".

Hiner et al., "Extended Landing Pad Substrate Package Structure and Method", U.S. Appl. No. 12/351,596, filed Jan. 9, 2009.

Berry et al., "Thin Stacked Interposer Package", U.S. Appl. No. 11/865,617, filed Oct. 1, 2007.

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", $58^{th}$ *ECTC Proceedings*, May 2008, Lake Buena Vista, FL, 6 pages, IEEE.

Wolf et al., "Silicon Processing for the VLSI Era: vol. 1- Process Technology", 1986, pp. 407-408.

Huemoeller et al., U.S. Appl. No. 12/151,857, filed May 9, 2008, entitled "Multi-Level Circuit Substrate and Fabrication Method".

Huemoeller et al., U.S. Appl. No. 11/982,637, filed Nov. 1, 2007, entitled "Circuit-On-Foil Process for Manufacturing a Laminated Semiconductor Package Substrate Having Embedded Conductive Patterns".

Huemoeller et al., U.S. Appl. No. 11/903,002, filed Sep. 19, 2007, entitled "Substrate Having Stiffener Fabrication Method".

Huemoeller et al., "Method and Structure for Creating Embedded Metal Features", U.S. Appl. No. 12/462,665, filed Aug. 5, 2009.

* cited by examiner

METHOD OF FABRICATING AN EMBEDDED CIRCUIT PATTERN

BACKGROUND OF THE INVENTION

1. Field of the Invention

The present invention relates generally to substrates for mounting of electronic components. More particularly, the present invention relates to a method of fabricating an embedded circuit pattern and the resulting structure.

2. Description of the Related Art

To form a circuit pattern, features in a dielectric layer are filled with plated copper. To prevent the formation of dimples in the plated copper as well as to ensure that the features are completely filled, an over-plate process is typically used.

During this over-plate process, the features are overfilled with plated copper such that the copper not only fills the features but also is plated with a significant thickness across the entire substrate.

The over-plate process is followed by an over-etch process. During this over-etch process, the excess plated copper is removed by etching. Further, to ensure that all of the excess plated copper is removed and to avoid shorts within the circuit pattern, the plated copper is over etched such that the circuit pattern is recessed into the dielectric layer.

Although the over-plate process and over-etch process are effective in producing a circuit pattern, the processes are inherently slow and thus have a high associated cost.

SUMMARY OF THE INVENTION

In accordance with one embodiment, a method of fabricating a substrate includes forming a first conductive layer on a dielectric layer, forming a resist layer on the first conductive layer, and forming laser-ablated artifacts through the first resist layer, through the first conductive layer, and at least partially into the dielectric layer. A second conductive layer is formed on the resist layer and within the laser-ablated artifacts. A portion of the second conductive layer is selectively removed such that the second conductive layer remains only within the laser-ablated artifacts.

The laser-ablated artifacts are filled to form an overfilled circuit pattern. The resist layer and the first conductive layer are removed. Further, a portion of the overfilled circuit pattern is removed to form an embedded circuit pattern embedded within the dielectric layer.

In one embodiment, the embedded circuit pattern has an absence of dimples. Accordingly, a dimple free embedded circuit pattern is formed without use of over-plate and/or over-etch processes. By avoiding over-plate and/or over-etch processes, the embedded circuit pattern is fabricated using a relatively quick method and thus at a low cost.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 4:
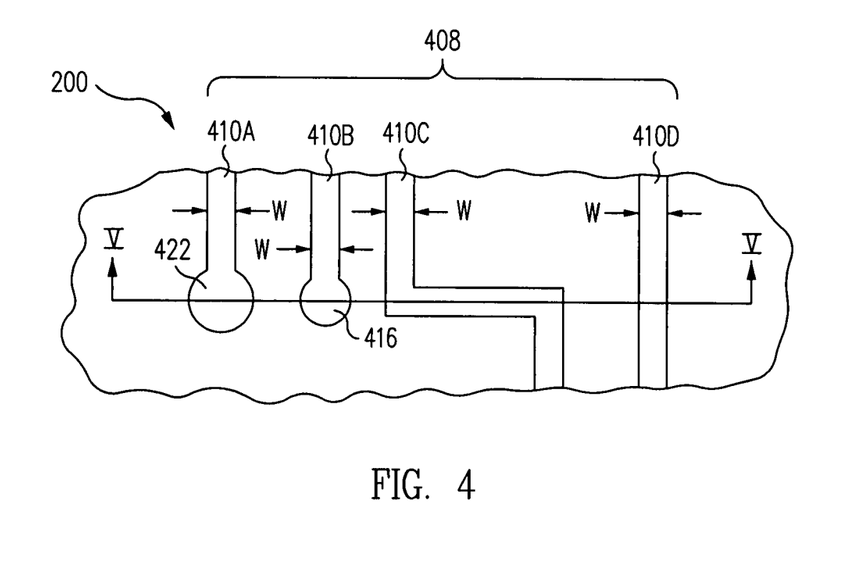
FIG. 4 is a top plan view of the substrate of FIG. 3 at a further stage during fabrication in accordance with one embodiment of the present invention.
Figure 5:
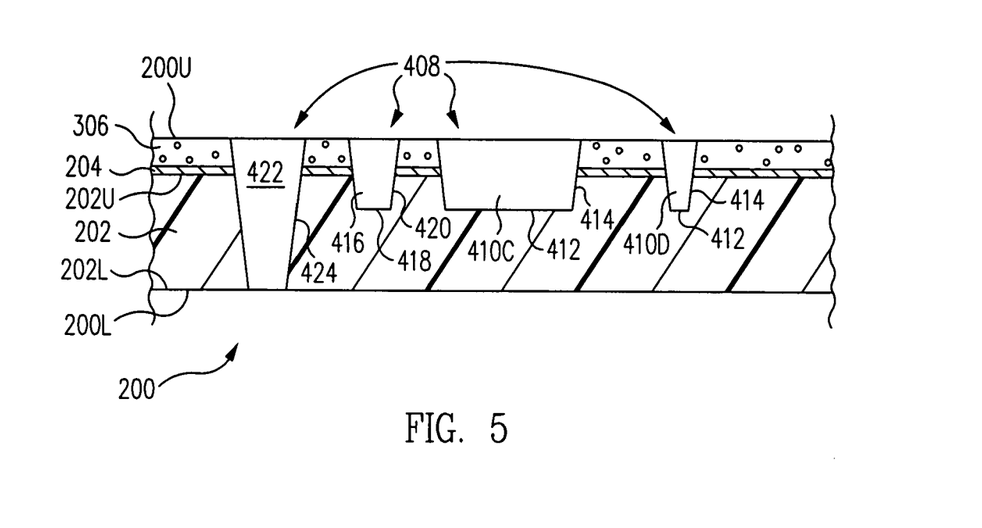
FIG. 5 is a cross-sectional view of the substrate of FIG. 4 along the line V-V in accordance with one embodiment of the present invention.

In accordance with one embodiment, referring to FIGS. 4 and 5 together, a method of fabricating a substrate 200 includes forming a first conductive layer 204 on a dielectric layer 202, forming a resist layer 306 on first conductive layer 204, and forming laser-ablated artifacts 408 through first resist layer 306, through first conductive layer 204, and at least partially into dielectric layer 202.

Figure 6:
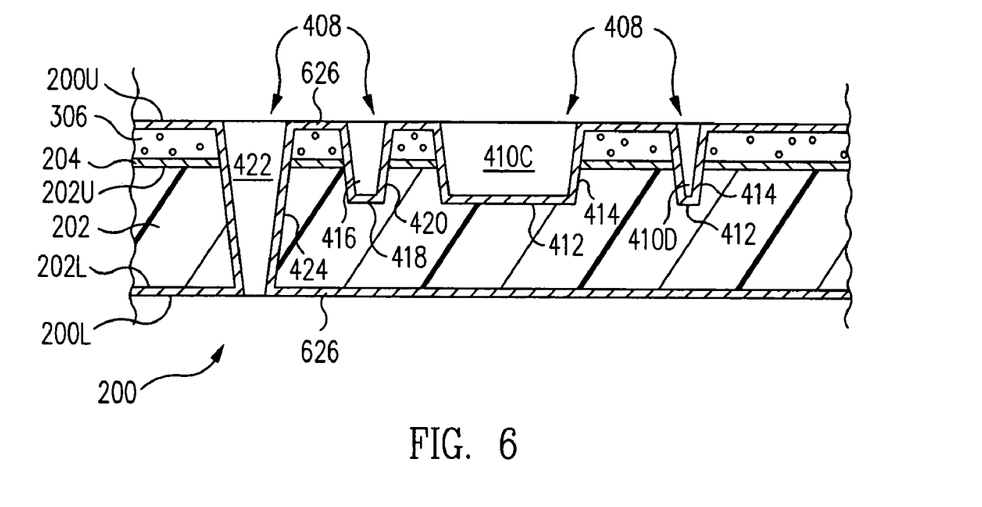
FIGS. 6, 7, 8, 9, 10 are cross-sectional views of the substrate of FIG. 5 at further stages during fabrication in accordance with embodiments of the present invention.
Figure 7:
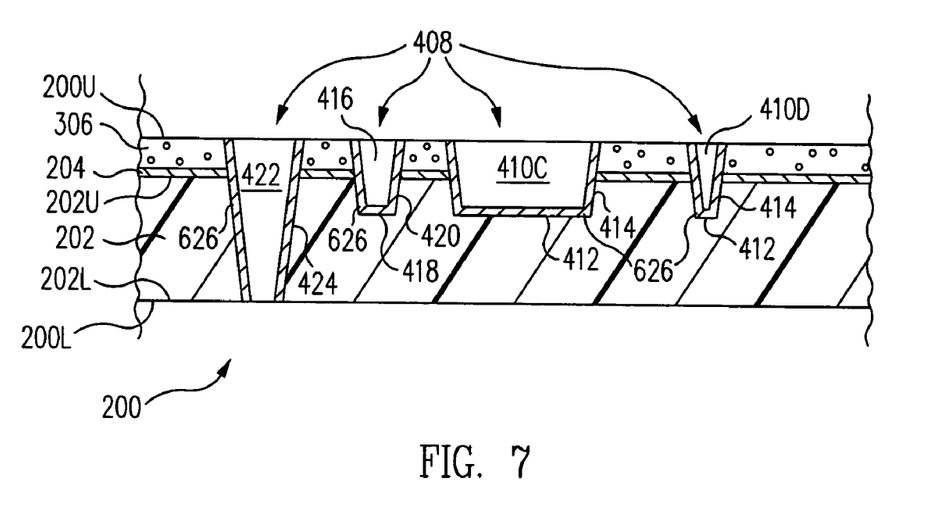
Figure 8:
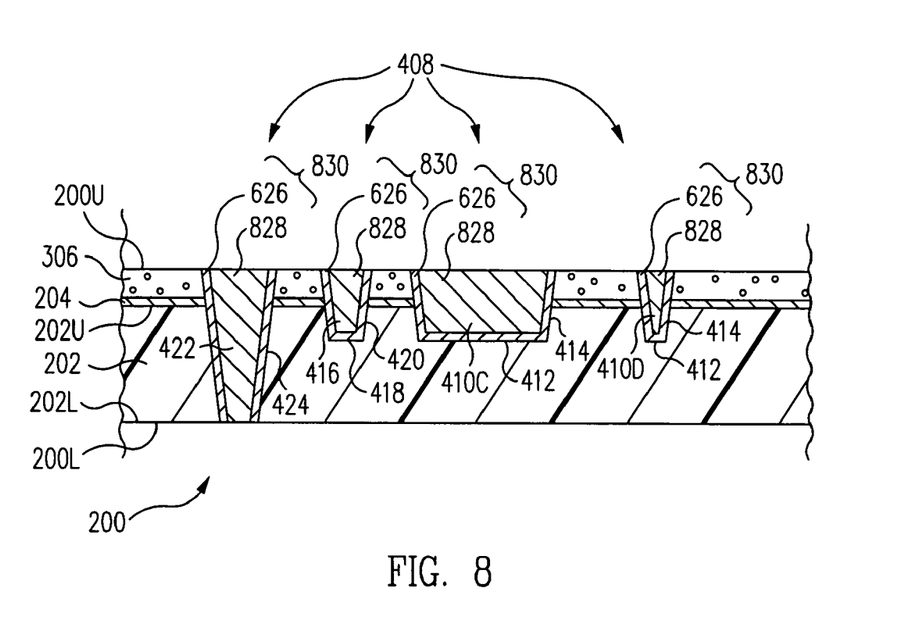

Referring to FIG. 6, a second conductive layer 626 is formed on resist layer 306 and within laser-ablated artifacts 408. Referring to FIG. 7, a portion of second conductive layer 626 is selectively removing such that second conductive layer 626 remains only within laser-ablated artifacts 408. Referring to FIG. 8, laser-ablated artifacts 408 are filled to form an overfilled circuit pattern 830.

Figure 9:
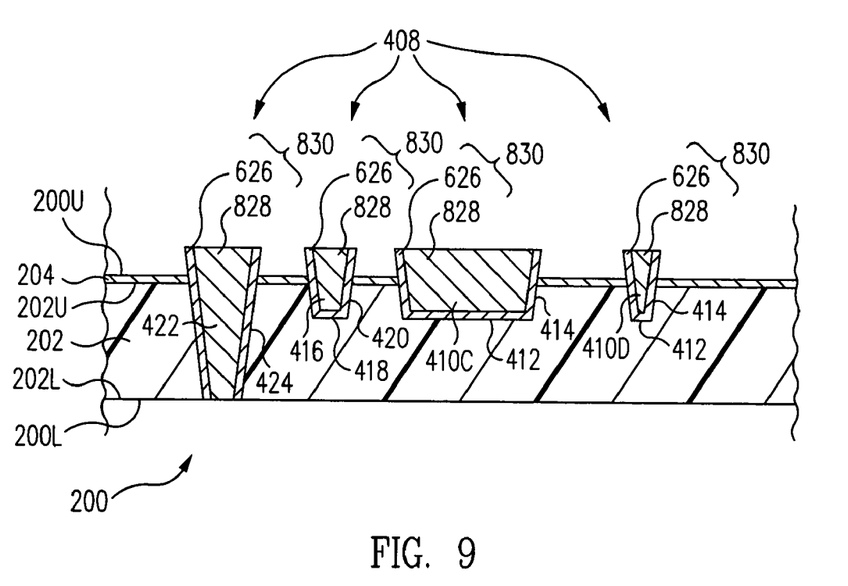
Figure 10:
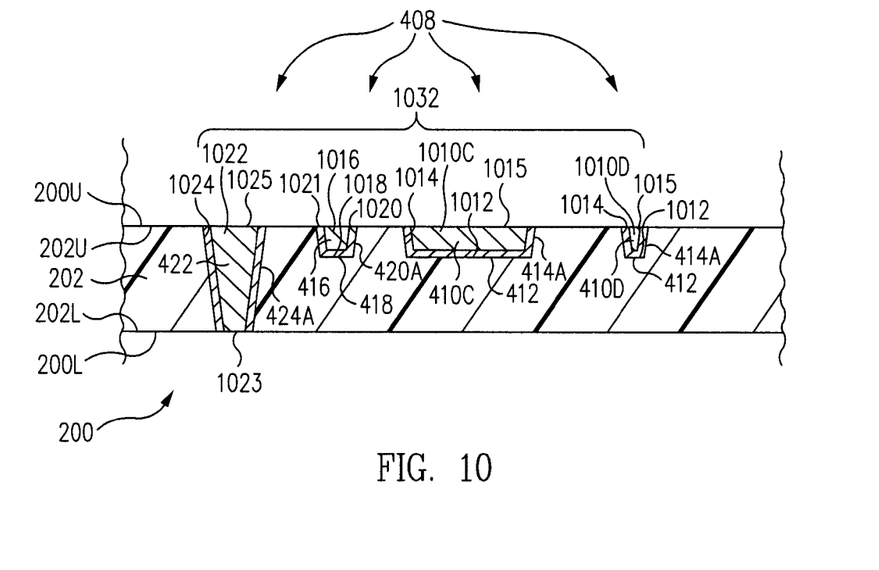

Referring to FIGS. 8 and 9 together, resist layer 306 is removed. Referring to FIGS. 9 and 10 together, first conductive layer 204 is removed and a portion of overfilled circuit pattern 830 is removed to form an embedded circuit pattern 1032 embedded within dielectric layer 202.

In one embodiment, embedded circuit pattern 1032 has an absence of dimples. Accordingly, a dimple free embedded circuit pattern 1032 is formed as set forth above without use of over-plate and/or over-etch processes. By avoiding over-plate and/or over-etch processes, embedded circuit pattern 1032 is fabricated using a relatively quick method and thus at a low cost.

Figure 1:
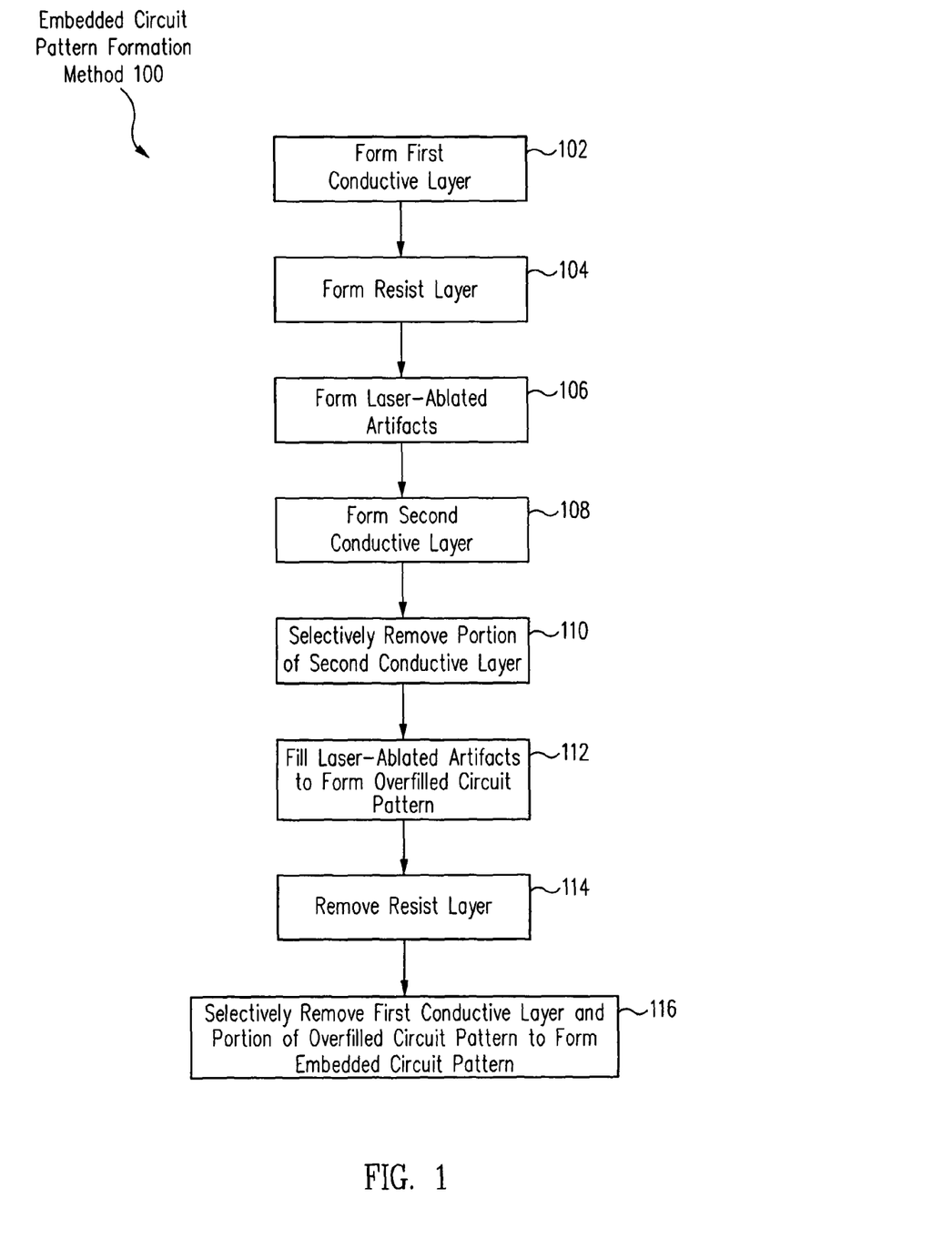
FIG. 1 is an embedded circuit pattern formation method in accordance with one embodiment of the present invention.
Figure 2:
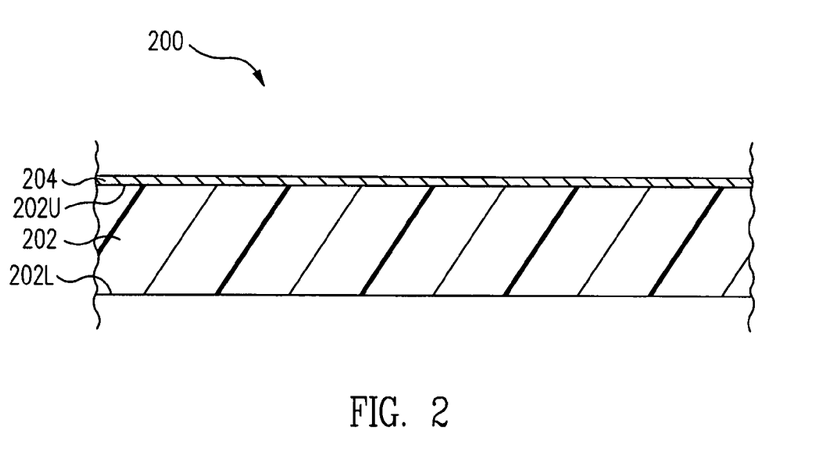
FIG. 2 is a cross-sectional view of a substrate during fabrication in accordance with one embodiment.

More particularly, FIG. 1 is an embedded circuit pattern formation method 100 in accordance with one embodiment of the present invention. FIG. 2 is a cross-sectional view of a substrate 200 during fabrication in accordance with one embodiment.

Referring now to FIGS. 1 and 2 together, substrate 200 includes a dielectric layer 202, e.g., an unclad core. Illustratively, dielectric layer 202 is printed circuit board material, molding compound, tape or other dielectric material.

Dielectric layer 202 includes an upper, e.g., first, surface 202U and a lower, e.g., second, surface 202L opposite upper surface 202U.

In FORM FIRST CONDUCTIVE LAYER OPERATION 102, a first conductive layer 204 is formed on dielectric layer 202, e.g., using a metallization process. More particularly, first conductive layer 204 is formed on upper surface 202U of dielectric layer 202 as illustrated in FIG. 2. In one embodiment, lower surface 202L is masked or otherwise protected such that first conductive layer 204 is formed only on upper surface 202U of dielectric layer 202. However, in another embodiment, first conductive layer 204 is formed on both upper surface 202U and lower surface 202L of dielectric layer 202.

In one embodiment, first conductive layer 204 is a thin first metal seed layer such as copper. In one embodiment, copper is plated using an electroless plating process to form first conductive layer 204. In another embodiment, copper is plated using a direct plating process to form first conductive layer 204.

In yet another embodiment, a copper clad laminate substrate comprises dielectric layer 202 and a copper clad, i.e., a copper layer or foil, attached to upper surface 202U of dielectric layer 202. The copper clad is etched or otherwise thinned to reduce the thickness of the copper clad and thus form first conductive layer 204 from the etched copper clad.

Figure 3:
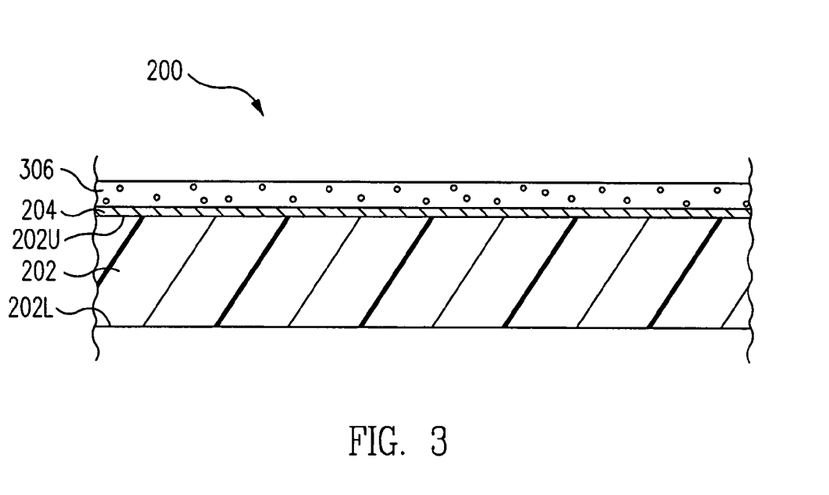
FIG. 3 is a cross-sectional view of the substrate of FIG. 2 at a further stage during fabrication in accordance with one embodiment of the present invention.

FIG. 3 is a cross-sectional view of substrate 200 of FIG. 2 at a further stage during fabrication in accordance with one embodiment of the present invention. Referring now to FIGS. 1 and 3 together, from FORM FIRST CONDUCTIVE LAYER OPERATION 102, flow moves to a FORM RESIST LAYER OPERATION 104. In FORM RESIST LAYER OPERATION 104, a resist layer 306 is formed on first conductive layer 204 as illustrated in FIG. 3. In one embodiment, a liquid is applied to first conductive layer 204, e.g., using a spin on process, and then cured to form resist layer 306. However, in other embodiments, resist layer 306 is formed of resist types other than spin on and liquid resists using any one of a number of resist layer formation techniques.

FIG. 4 is a top plan view of substrate 200 of FIG. 3 at a further stage during fabrication in accordance with one embodiment of the present invention. FIG. 5 is a cross-sectional view of substrate 200 of FIG. 4 along the line V-V in accordance with one embodiment of the present invention.

Referring now to FIGS. 1, 4, and 5 together, from FORM RESIST LAYER OPERATION 104, flow moves to a FORM LASER-ABLATED ARTIFACTS OPERATION 106. In FORM LASER-ABLATED ARTIFACTS OPERATION 106, laser-ablated artifacts 408 are formed in substrate 200 as illustrated in FIGS. 4 and 5.

Laser-ablated artifacts 408 are formed using a laser-ablation process. During this laser-ablation process, a laser beam is directed at resist layer 306 and moved. The laser beam laser-ablates through resist layer 306, through first conductive layer 204 and at least partially laser-ablates dielectric layer 202. Accordingly, laser-ablated artifacts 408 are formed through resist layer 306, through first conductive layer 204, and at least partially into dielectric layer 202. As illustrated in FIG. 4, laser-ablated artifacts 408 have a taper profile with the greatest width at resist layer 306 due to the laser-ablation process.

Laser-ablated artifacts 408 include laser-ablated channels, laser-ablated land openings, and/or laser-ablated via apertures. Generally, channels, land openings, and via apertures are particularly shaped laser-ablated voids in substrate 200.

In one embodiment, a laser-ablated channel, sometimes called a trench, extends horizontally and in a direction parallel with an upper, e.g., first, surface 200U of substrate 200, i.e., the upper surface of resist layer 306. In one embodiment, a laser-ablated channel has the width of the laser beam used to form the laser-ablated channel.

To illustrate, laser-ablated artifacts 408 include laser-ablated channels 410A, 410B, 410C, 410D, collectively referred to as laser-ablated channels 410. Laser-ablated channels 410 have a uniform width W equal to the width of the laser beam used to form laser-ablated channels 410. However, in another embodiment, laser-ablated channels 410 have various widths.

Laser-ablated channels 410 are defined by channel bases 412, i.e., recessed surfaces of dielectric layer 202. Channel bases 412 are recessed below upper surface 200U of substrate 200 and more particularly are recessed below resist layer 306 and first conductive layer 204. Stated another way, channel bases 412 are between a plane defined by upper surface 202U of dielectric layer 202 and a plane defined by lower surface 202L of dielectric layer 202 such that dielectric layer 202 remains between channel bases 412 and lower surface 202L of dielectric layer 202.

Laser-ablated channels 410 are further defined by channel sidewalls 414. Channel sidewalls 414 extend between channel bases 412 and upper surface 200U of substrate 200. Channel sidewalls 414 are formed by dielectric layer 202, first conductive layer 204, and resist layer 306.

In one embodiment, a laser-ablated land opening is an opening, e.g., a circular, rectangular, or other shaped opening, formed using a repeated, e.g., a trepanning, motion of the laser beam. Accordingly, a laser-ablated land opening has a width greater than the width of the laser beam used to form the laser-ablated land opening in one embodiment.

To illustrate, laser-ablated artifacts 408 include a laser-ablated land opening 416. Laser-ablated land opening 416 is an opening through resist layer 306, through first conductive layer 204 and partially into dielectric layer 202.

Laser-ablated land opening 416 is defined by a land opening base 418, i.e., a recessed surface of dielectric layer 202. Land opening base 418 is recessed below upper surface 200U of substrate 200 and more particularly is recessed below resist layer 306 and first conductive layer 204. Stated another way, land opening base 418 is between a plane defined by upper surface 202U of dielectric layer 202 and a plane defined by lower surface 202L of dielectric layer 202 such that dielectric layer 202 remains between land opening base 418 and lower surface 202L of dielectric layer 202.

Laser-ablated land opening 416 is further defined by a land opening sidewall 420. Land opening sidewall 420 extends between land opening base 418 and upper surface 200U of substrate 200. Land opening sidewall 420 is formed by dielectric layer 202, first conductive layer 204, and resist layer 306.

In one embodiment, a laser-ablated via opening is an opening extending entirely through substrate 200 in a direction perpendicular to upper surface 200U of substrate 200.

To illustrate, laser-ablated artifacts 408 include a laser-ablated via opening 422, which is a blind via opening in one embodiment. Laser-ablated via opening 422 is an opening through resist layer 306, through first conductive layer 204, and through dielectric layer 202.

Laser-ablated via opening 422 is defined by a via opening sidewall 424 extending between upper surface 200U and a lower, e.g., second, surface 200L of substrate 200. Via opening sidewall 424 is formed by dielectric layer 202, first conductive layer 204, and resist layer 306.

As set forth above, formation of laser-ablated artifacts 408 exposes first conductive layer 204 within laser-ablated artifacts 408. More particularly, first conductive layer 204 forms a part of and is exposed at channel sidewalls 414, land opening sidewall 420, and via opening sidewall 424.

Although various laser-ablated artifacts 408 are illustrated in FIGS. 4 and 5, in light of this disclosure, those of skill in the art will understand that any one of a number of laser-ablated artifacts can be formed.

FIG. 6 is a cross-sectional view of substrate 200 of FIG. 5 at a further stage during fabrication in accordance with one embodiment of the present invention. Referring now to FIGS. 1 and 6 together, from FORM LASER-ABLATED ARTIFACTS OPERATION 106, flow moves to a FORM SECOND CONDUCTIVE LAYER OPERATION 108. In FORM SECOND CONDUCTIVE LAYER OPERATION 108, a second conductive layer 626 is formed as illustrated in FIG. 6.

Second conductive layer 626 is formed directly on all exposed surfaces of substrate 200. More particularly, second conductive layer 626 is formed on upper surface 200U of substrate 200, i.e., on resist layer 306, and lower surface 200L of substrate 200.

Further, second conductive layer 626 is formed within laser-ablated artifacts 408. More particularly, second conductive layer 626 is formed on channel bases 412 and channel sidewalls 414 of laser-ablated channels 410. Second conductive layer 626 is formed on land opening base 418 and land opening sidewall 420 of laser-ablated land opening 416. Further, second conductive layer 626 is formed on via opening sidewall 424 of laser-ablated via opening 422.

As second conductive layer 626 is formed on channel sidewalls 414, land opening sidewall 420, via opening sidewall 424 and thus on first conductive layer 204, second conductive layer 626 is electrically coupled to first conductive layer 204.

In one embodiment, second conductive layer 626 is a thin second metal seed layer such as copper. For example, copper is plated using an electroless plating process to form second conductive layer 626. In another embodiment, copper is plated using a direct plating process to form second conductive layer 626.

FIG. 7 is a cross-sectional view of substrate 200 of FIG. 6 at a further stage during fabrication in accordance with one embodiment of the present invention. Referring now to FIGS. 1 and 7 together, from FORM SECOND CONDUCTIVE LAYER OPERATION 108, flow moves to a SELECTIVELY REMOVE PORTION OF SECOND CONDUCTIVE LAYER OPERATION 110. In SELECTIVELY REMOVE PORTION OF SECOND CONDUCTIVE LAYER OPERATION 110, a portion of second conductive layer 626 is removed, e.g., by mechanical polish, as illustrated in FIG. 7.

More particularly, the portion of second conductive layer 626 on upper surface 200U and lower surface 200L of substrate 200 is removed, e.g., by mechanical polishing. Accordingly, the remaining portion of second conductive layer 626 remains only within laser-ablated artifacts 408 and remains electrically connected to first conductive layer 204.

FIG. 8 is a cross-sectional view of substrate 200 of FIG. 7 at a further stage during fabrication in accordance with one embodiment of the present invention. Referring now to FIGS. 1 and 8 together, from SELECTIVELY REMOVE PORTION OF SECOND CONDUCTIVE LAYER OPERATION 110, flow moves to a FILL LASER-ABLATED ARTIFACTS TO FORM OVERFILLED CIRCUIT PATTERN OPERATION 112. In FILL LASER-ABLATED ARTIFACTS TO FORM OVERFILLED CIRCUIT PATTERN OPERATION 112, laser-ablated artifacts 408 are filled with an electrically conductive laser-ablated artifact filler material 828 to form an overfilled circuit pattern 830 within laser-ablated artifacts 408 as illustrated in FIG. 8. Overfilled circuit pattern 830 includes a bilayer structure of second conductive layer 626 and filler material 828 within laser-ablated artifacts 408. More particularly, filler material 828 is within laser-ablated artifacts 408 within second conductive layer 626.

In accordance with one embodiment, laser-ablated artifacts 408 are filled with filler material 828 using a plating process, e.g., an electroplating process, in which first conductive layer 204 and second conductive layer 626 collectively form the electroplating electrode. More particularly, first conductive layer 204 is biased (relative to a counter electrode) by forming an electrical connection to first conductive layer 204. As first conductive layer 204 is electrically connected to second conductive layer 626, second conductive layer 626 is also biased causing metal, e.g., copper, to be plated on second conductive layer 626 thus filling laser-ablated artifacts 408. In one embodiment, laser-ablated artifacts 408 are not overplated.

FIG. 9 is a cross-sectional view of substrate 200 of FIG. 8 at a further stage during fabrication in accordance with one embodiment of the present invention. Referring now to FIGS. 1 and 9 together, from FILL LASER-ABLATED ARTIFACTS TO FORM OVERFILLED CIRCUIT PATTERN OPERATION 112, flow moves to a REMOVE RESIST LAYER OPERATION 114. In REMOVE RESIST LAYER OPERATION 114, resist layer 306 is removed as illustrated in FIG. 9.

As shown in FIG. 9, after removal, e.g., stripping, resist layer 306, first conductive layer 204 is exposed. Further, overfilled circuit pattern 830, that was flush with the upper surface of resist layer 306, protrudes from dielectric layer 202 through first conductive layer 204 to a height slightly above first conductive layer 204.

FIG. 10 is a cross-sectional view of substrate 200 of FIG. 9 at a further stage during fabrication in accordance with one embodiment of the present invention. Referring now to FIGS. 1 and 10 together, from REMOVE RESIST LAYER OPERATION 114, flow moves to a SELECTIVELY REMOVE FIRST CONDUCTIVE LAYER AND PORTION OF OVERFILLED CIRCUIT PATTERN TO FORM EMBEDDED CIRCUIT PATTERN OPERATION 116. In SELECTIVELY REMOVE FIRST CONDUCTIVE LAYER AND PORTION OF OVERFILLED CIRCUIT PATTERN TO FORM EMBEDDED CIRCUIT PATTERN OPERATION 116, first conductive layer 204 and the protruding portion of overfilled circuit pattern 830 are removed to form embedded circuit pattern 1032 as shown in FIG. 10.

In one embodiment, an etch plus mechanical scrub, e.g., a flash etch, is performed to remove first conductive layer 204 and the protruding portion of overfilled circuit pattern 830. Accordingly, the removal, sometimes called controlled etch down process, is minimal and is completed quickly with a minimal associated cost.

Embedded circuit pattern 1032 has an absence of dimples. Accordingly, embedded circuit pattern formation method 100 results in the formation of dimple free embedded circuit pattern 1032 without use of over-plate and/or over-etch processes. Accordingly, embedded circuit pattern formation method 100 is a relatively quick method and thus performed at a low cost.

After removal of first conductive layer 204 and the protruding portion of overfilled circuit pattern 830, laser-ablated artifacts 408 remain only within dielectric layer 202. To illustrate, laser-ablated channels 410 (410C, 410D) are defined by channel sidewalls 414A and channel bases 412. Channel sidewalls 414A extend between channel bases 412 and upper surface 202U of dielectric layer 202.

Laser-ablated land opening 416 is defined by land opening base 418 and a land opening sidewall 420A. Land opening sidewall 420A extends between land opening base 418 and upper surface 202U of dielectric layer 202.

Laser-ablated via opening 422 is defined by a via opening sidewall 424A extend the between upper surface 202U and lower surface 202L of dielectric layer 202.

As shown in FIG. 10, embedded circuit pattern 1032 is embedded within dielectric layer 202. Embedded circuit pattern 1032 includes electrically conductive traces, lands, and/or vias. Embedded circuit pattern 1032 has an absence of dimples.

In one embodiment, a trace extends horizontally and in a direction parallel with upper surface 202U of dielectric layer 202.

To illustrate, embedded circuit pattern 1032 includes traces 1010C, 1010D, collectively traces 1010, formed within laser-ablated channels 410C, 410D, respectively. Traces 1010 include trace bases 1012 in direct contact with channel bases 412. Traces bases 1012 are recessed below upper surface 202U of dielectric layer 202. Stated another way, trace bases 1012 are between a plane defined by upper surface 202U of dielectric layer 202 and a plane defined by lower surface 202L of dielectric layer 202 such that dielectric layer 202 remains between trace bases 1012 and lower surface 202L of dielectric layer 202.

Traces 1010 further include trace sidewalls 1014 in direct contact with channel sidewalls 414A. Traces sidewalls 1014 extend between trace bases 1012 and upper surface 202U of dielectric layer 202. Traces 1010 further include trace top surfaces 1015 coplanar with upper surface 202U of dielectric layer 202.

To further illustrate, embedded circuit pattern 1032 includes a land 1016 formed within laser-ablated land opening 416. Land 1016 includes a land base 1018 in direct contact with land opening base 418. Land base 1018 is recessed below upper surface 202U of dielectric layer 202. Stated another way, land base 1018 is between a plane defined by upper surface 202U of dielectric layer 202 and a plane defined by lower surface 202L of dielectric layer 202 such that dielectric layer 202 remains between land base 1018 and lower surface 202L of dielectric layer 202.

Land 1016 further includes a land sidewall 1020 in direct contact with land opening sidewall 420A. Land sidewall 1020 extends between land base 1018 and upper surface 202U of dielectric layer 202. Land 1016 further includes land top surface 1021 coplanar with upper surface 202U of dielectric layer 202.

To further illustrate, embedded circuit pattern 1032 includes a via 1022, e.g., a blind via, formed within laser-ablated via opening 422. Via 1022 includes a via sidewall 1024 in direct contact with via opening sidewall 424A. Via sidewall 1024 extends between upper surface 202U and lower surface 202L of dielectric layer 202. Via 1022 further includes a via base surface 1023 coplanar with lower surface 202L of dielectric layer 202. Via 1022 further includes a via top surface 1025 coplanar with upper surface 202U of dielectric layer 202.

Although various features of embedded circuit pattern 1032 are illustrated in FIG. 10, in light of this disclosure, those of skill in the art will understand that embedded circuit pattern 1032 is formed with any one of a number of electrically conductive features in other embodiments.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of fabricating a substrate comprising:
   forming a first conductive layer on a dielectric layer;
   forming a resist layer on the first conductive layer;
   forming laser-ablated artifacts through the first resist layer, through the first conductive layer, and at least partially into the dielectric layer, wherein the first conductive layer is exposed within the laser-ablated artifacts;
   forming a second conductive layer on the resist layer and within the laser-ablated artifacts, the second conductive layer being electrically coupled to the first conductive layer;
   selectively removing a portion of the second conductive layer such that the second conductive layer remains only within the laser-ablated artifacts;
   subsequent to the selectively removing a portion of the second conductive layer, filling the laser-ablated artifacts to form an overfilled circuit pattern;
   removing the resist layer; and
   selectively removing the first conductive layer and a portion of the overfilled circuit pattern to form an embedded circuit pattern, the embedded circuit pattern being embedded within the dielectric layer.

2. The method of claim 1
   wherein the overfilled circuit pattern comprises the second conductive layer and an electrically conductive filler material; and
   wherein the overfilled circuit pattern protrudes through the first conductive layer to a height above the first conductive layer.

3. The method of claim 1 wherein the laser-ablated artifacts include a laser-ablated channel.

4. The method of claim 3 wherein the laser-ablated channel extends in a direction parallel with a first surface of the substrate.

5. The method of claim 3 wherein the laser-ablated channel is defined by a channel base and a channel sidewall, the channel base being between a first surface of the dielectric layer and a second surface of the dielectric layer, the channel sidewall extending between the channel base and a first surface of the substrate.

6. The method of claim 1 wherein the laser-ablated artifacts include a laser-ablated land opening.

7. The method of claim 6 wherein the laser-ablated land opening is defined by a land opening base and a land opening sidewall, the land opening base being between a first surface of the dielectric layer and a second surface of the dielectric layer, the land opening sidewall extending between the land opening base and a first surface of the substrate.

8. The method of claim 1 wherein the laser-ablated artifacts include a laser-ablated via opening.

9. The method of claim 8 wherein the laser-ablated via opening is defined by a via opening sidewall extending between a first surface and a second surface of the substrate.

10. The method of claim 1 wherein the filling the laser-ablated artifacts is performed using an electroplating process in which the first conductive layer and the second conductive layer are collectively used as an electroplating electrode.

11. The method of claim 10 wherein the laser-ablated artifacts are not overplated during the filling the laser-ablated artifacts.

12. The method of claim 1
   wherein the laser-ablated artifacts comprising a laser-ablated channel defined by a channel base and a channel sidewall, the channel base being between a first surface of the dielectric layer and a second surface of the dielectric layer, the channel sidewall extending between the channel base and a first surface of the substrate,
   wherein the overfilled circuit pattern protrudes through the first conductive layer to a height above the first conductive layer.

13. The method of claim 12 wherein the embedded circuit pattern comprises a trace within the laser-ablated channel, the trace comprising a trace base and a trace sidewall, the trace base being between the first surface of the dielectric layer and the second surface of the dielectric layer, the trace sidewall extending between the trace base and the first surface of the dielectric layer.

* * * * *